United States Patent
Hopper et al.

(10) Patent No.: US 7,209,503 B1
(45) Date of Patent: Apr. 24, 2007

(54) LASER POWERED INTEGRATED CIRCUIT

(75) Inventors: Peter J. Hopper, San Jose, CA (US);
Philipp Lindorfer, San Jose, CA (US);
Vladislav Vashchenko, Palo Alto, CA (US); Yuri Mirgorodski, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 274 days.

(21) Appl. No.: 10/838,671

(22) Filed: May 3, 2004

(51) Int. Cl.
*H01S 5/00* (2006.01)
(52) U.S. Cl. .................... 372/43; 372/50.1; 372/50.124
(58) Field of Classification Search ................. 372/43, 372/50.1, 50.124
See application file for complete search history.

(56) References Cited

U.S. PATENT DOCUMENTS

| | | | |
|---|---|---|---|
| 4,542,289 A | 9/1985 | Yokoyama et al. | 250/201 |
| 4,544,938 A | 10/1985 | Scholl | 357/30 |
| 5,442,475 A | 8/1995 | Bausman et al. | 359/140 |
| 5,521,736 A | 5/1996 | Swirhun et al. | 359/158 |
| 5,889,903 A | 3/1999 | Rao | 385/14 |
| 6,653,706 B1 | 11/2003 | Miller et al. | 257/444 |
| 2005/0146934 A1* | 7/2005 | Forbes et al. | 365/185.12 |

* cited by examiner

*Primary Examiner*—Dung (Micheal) T. Nguyen
(74) *Attorney, Agent, or Firm*—Mark C. Pickering

(57) ABSTRACT

An integrated circuit is powered by exposing conductive regions, such as the p+ source regions of the PMOS transistors that are formed to receive a supply voltage, to light energy from a light source. The conductive regions function as photodiodes that produce voltages on the conductive regions via the photovoltaic effect.

20 Claims, 3 Drawing Sheets

LASER POWERED INTEGRATED CIRCUIT

RELATED APPLICATION

The present application is related to application Ser. No. 10/838,485 for Laser Powered Clock Circuit with a Substantially Reduced Clock Skew by Peter Hopper et al. which is filed on an even date herewith.

BACKGROUND OF THE INVENTION

1. Field of the Invention

The present invention relates to integrated circuits and, more particularly, to a laser powered integrated circuit.

2. Description of the Related Art

Integrated circuits typically have power supply circuits that receive, regulate, and distribute power to the functional circuits within the integrated circuits. Functional circuits commonly extract power from the power supply via a PMOS transistor, where the gate of the PMOS transistor is used to control whether a current from the power supply can flow through the transistor.

FIG. 1 shows a schematic diagram that illustrates a prior-art functional circuit 100. As shown in FIG. 1, circuit 100 includes a PMOS transistor 110 that has a source 110A connected to a power supply voltage VCC, a gate 110B connected to an input node $N_{IN}$, and a drain 110C connected to an output node $N_{OUT}$. As further shown in FIG. 1, circuit 100 also includes an NMOS transistor 112 that has a source 112A connected to ground, a gate 112B connected to the input node $N_{IN}$, and a drain 112C connected to the output node $N_{OUT}$.

In operation, when the voltage on the gates 110B and 112B of transistors 110 and 112 rises and is within a PMOS threshold voltage of the supply voltage VCC, transistor 110 is turned off, and transistor 112 is turned on. As a result, transistor 112 pulls the voltage on the output node $N_{OUT}$ down to ground.

On the other hand, when the voltage on the gates 110B and 112B of transistors 110 and 112 falls and is within an NMOS threshold voltage of ground, transistor 110 turns on and transistor 112 turns off. As a result, transistor 110 sources a current to the output node $N_{OUT}$ that pulls up the voltage on the output node $N_{OUT}$.

Although the operation of circuit 100 is simple and straightforward, the power supply circuits required to provide power to the source of PMOS transistor 110 have a number of significant associated issues. Some of the issues include a dynamic IR drop that is related to variations in the power supply, ground bounce, and latch up that is related to power supply bouncing.

In addition, a wider library characterization should be used to take into account the wider guard banding of gate characteristics in the time domain that is due to power supply voltage variation. Further issues include power supply related noise, cross talk, and joule heating. Dynamic or static power supply variation can also lead to clock skew and related timing closure difficulties.

Additional issues include an elevated area density due to the area requirement of the power supply routing metal, vias, and contacts, and the increased complexity, including IC CAD complexity, due to the power supply routing. There are also wider electro-migration requirements due to the power supply requirements, and non-isothermal heating related glitches that have no available debug mechanism.

As a result, there is a need for an approach of providing power to the functional circuits of an integrated circuit that reduces or eliminates the above noted issues that are associated with conventional power supply circuits.

DETAILED DESCRIPTION OF THE INVENTION

Figure 1:
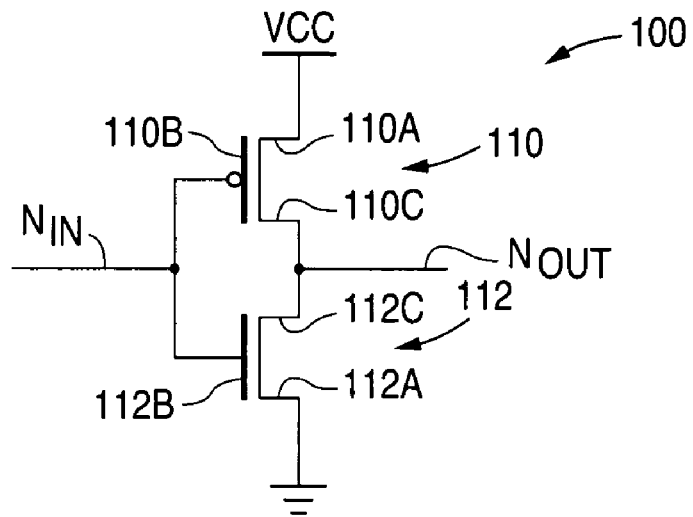
FIG. 1 is a schematic diagram illustrating a prior-art functional circuit 100.
Figure 2:
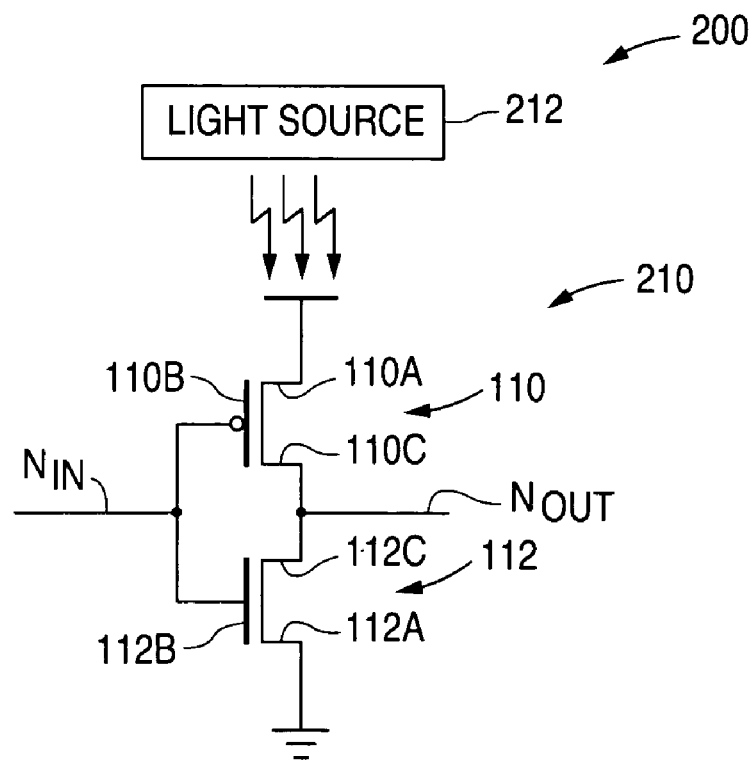
FIG. 2 is a schematic diagram illustrating an example of a laser powered integrated circuit 200 in accordance with the present invention.

FIG. 2 shows a schematic diagram that illustrates an example of a laser powered integrated circuit 200 in accordance with the present invention. As described in greater detail below, the integrated circuit of the present invention utilizes the photovoltaic effect to generate voltages and currents that are used by the functional circuits within the integrated circuit.

As shown in FIG. 2, integrated circuit 200 includes a functional circuit 210 which can be implemented with, for example, functional circuit 100, and a light source 212 that illuminates selected portions of functional circuit 210. In the FIG. 2 example, functional circuit 210 utilizes the reference numerals of functional circuit 100.

In operation, when integrated circuit 200 is powered on, light source 212 illuminates source 110A of PMOS transistor 110 with light energy in the form of photons. The photovoltaic effect, which results when the incident photons from light source 212 are absorbed in the depletion region that lies between source 110A and the body of transistor 110, provides a source voltage that is equal to the forward bias voltage across the junction between source 110A and the body (approximately 0.6V), and a current (number of charge carriers) that is a function of the intensities and the wavelengths of the light that are output by light source 212.

The wavelengths of light output by light source 212 include the wavelengths of light that have the highest likelihood of being absorbed in the depletion region that lies between source 110A and the body of transistor 110. For example, these wavelengths can include green and blue-green wavelengths of light.

The intensities of the wavelengths of light output by light source 212 can be varied to vary the number of charge carriers that are available to participate in a current flow. In addition, the size of source 110A of PMOS transistor 110 can be varied to vary the number of available charge carriers.

Alternately, a larger current can be provided by using multiple PMOS transistors that are formed in parallel. In this case, the sources of the PMOS transistors are each illuminated by light source 212, the gates of the transistors are all connected to the input node $N_{IN}$, and the drains are all connected to the output node $N_{OUT}$.

Figure 3:
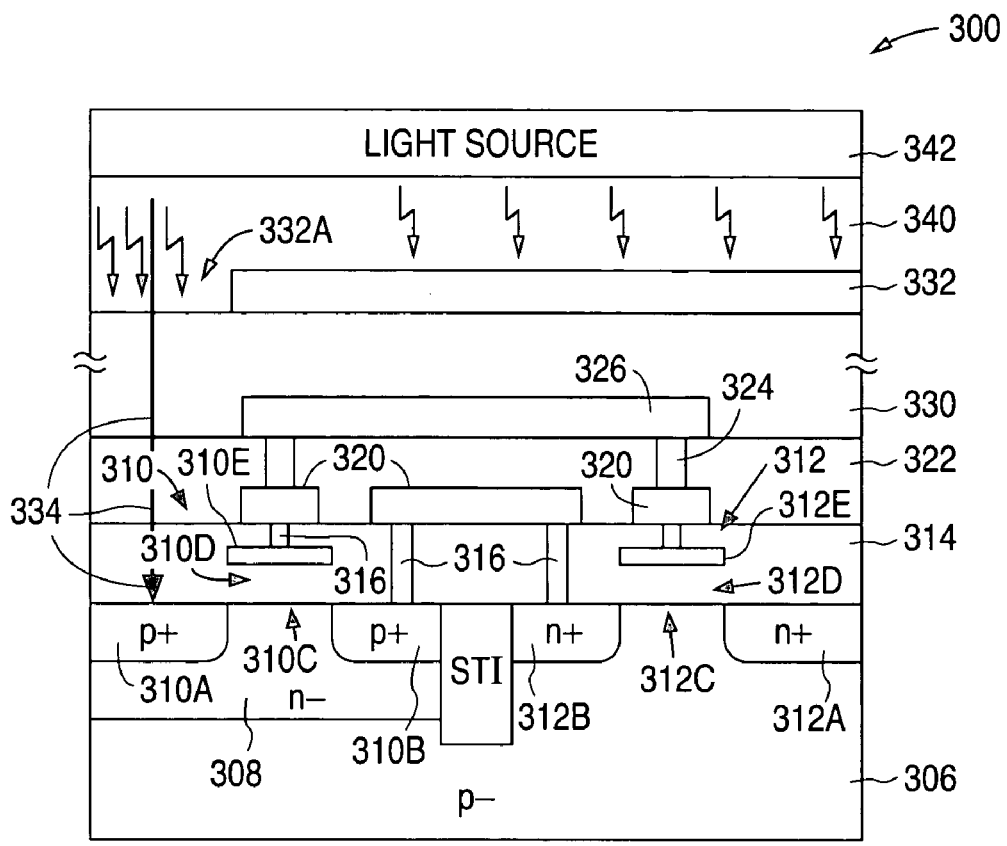
FIG. 3 is a cross-sectional diagram illustrating an example of a laser powered integrated circuit 300 in accordance with the present invention.

FIG. 3 shows a cross-sectional diagram that illustrates an example of a laser powered integrated circuit 300 in accordance with the present invention. As shown in FIG. 3, integrated circuit 300, which represents an implementation of integrated circuit 200, includes a PMOS transistor 310 that has spaced-apart p+ source and drain regions 310A and 310B that are formed in a lightly-doped (n−) semiconductor material 308.

In the example shown in FIG. 3, n− semiconductor material 308 is implemented as an n− well that is formed in a p− semiconductor substrate 306. In addition, source region 310A is formed to maximize the creation of photogenerated charge carriers, and the charge storage efficiency of region 310A.

As further shown in FIG. 3, PMOS transistor 310 has a channel region 310C that is located between the source and drain regions 310A and 310B, an isolation material 310D that is formed on channel region 310C, and a gate 310E that is formed on isolation material 310D over channel region 310C.

In addition to PMOS transistor 310, integrated circuit 300 includes an NMOS transistor 312 that has spaced-apart n+ source and drain regions 312A and 312B that are formed in p− semiconductor substrate 306, and separated from p+ source and drain regions 310A and 310B by a shallow trench isolation (STI) region. NMOS transistor 312 also has a channel region 312C that is located between the source and drain regions 312A and 312B, an isolation material 312D that is formed on channel region 312C, and a gate 312E that is formed on isolation material 312D over channel region 312C.

Integrated circuit 300 further includes a layer of insulation material 314 that is formed over the source and drain regions 310A/312A and 310B/312B, and the gates 310E/312E of transistors 310 and 312. Insulation material 314, which can be implemented with, for example, oxide, is substantially transparent to the wavelengths of light, e.g., green, that are directed at source 310A.

In addition, circuit 300 includes a number of contacts 316 that are formed through insulation layer 314 to make electrical connections with the sources 310A/312A, the drains 310B/312B, and the gates 310E/312E, and a number of metal-1 traces 320 that are formed on insulation layer 314 to make electrical connections with the contacts 316.

Further, integrated circuit 300 includes a layer of isolating material 322 that is formed on insulation material 314 over the metal-1 traces 320. Isolating material 322, which can be implemented with, for example, oxide, is substantially transparent to the wavelengths of light, e.g., green, that are directed at source 310A.

Integrated circuit 300 additionally includes a number of vias 324 that are formed through isolating layer 322 to make electrical connections with the metal-1 traces 320, and a number of metal-2 traces 326 that are formed on isolating layer 322 to make electrical connections with the vias 324.

Further, integrated circuit 300 includes a layer of protective material 330 that is formed over the isolating layer 322 and the metal-2 traces 326 (a number of layers of a metal interconnect structure can be connected to the metal-2 traces and lie between the metal-2 traces and protective layer 330), and a layer of metal 332 that is formed on protective layer 330. Protective material 330 is substantially transparent to the wavelengths of light, e.g., green, that are directed at source 310A.

In accordance with the present invention, metal layer 332 has an opening 332A that extends through metal layer 332. In the FIG. 3 example, the size of opening 332A is substantially the same as the size of source region 310A, and opening 332A is vertically aligned with source 310A. (Opening 332A can be slightly offset to accommodate light rays which are slightly non-normal to the top surface of metal layer 332.)

In addition, in further accordance with the present invention, the metal interconnect structure is formed such that a substantially optically transparent pathway 334 can extend from opening 332A to source 310A in a direction that is normal (or near normal) to the top surface of metal layer 332.

Thus, when a large number of source regions in an integrated circuit are to be powered by the photovoltaic effect, metal layer 332 can have, for example, a checkerboard opening or a large number of smaller openings that expose, and are substantially vertically aligned with, the source and other regions of the integrated circuit that function as the photodiodes.

Figure 3A:
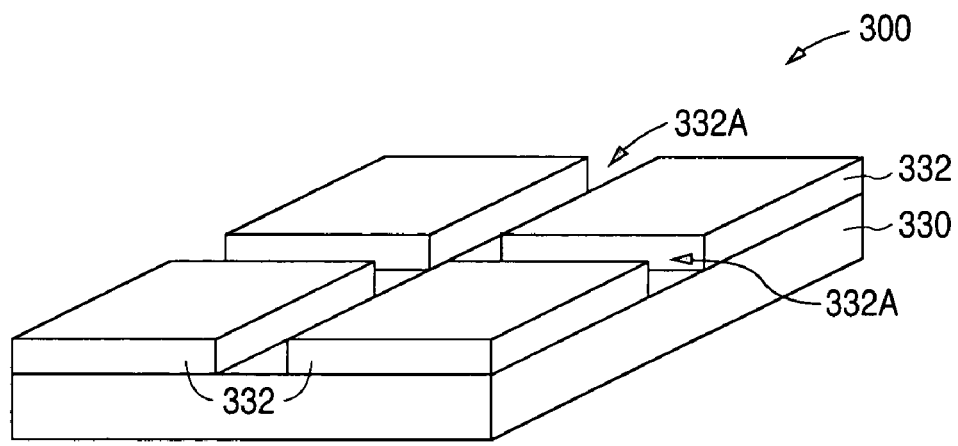
FIG. 3A is a perspective view further illustrating an example of integrated circuit 300 in accordance with the present invention.

FIG. 3A shows a perspective view that further illustrates an example of integrated circuit 300 in accordance with the present invention. As shown in FIG. 3A, metal layer 332 of integrated circuit 300 can have an opening 332A that has a checkerboard pattern. In this example, the photodiode regions below opening 332A, e.g., the source and other regions, generate a forward bias voltage of approximately 0.6V, but the large size of opening 332A increases the available current.

Regardless of the shape of opening 332A, the metal interconnect structure is formed such that a substantially optically transparent pathway extends from each opening in metal layer 332 to the source and other regions of the integrated circuit that function as photodiodes in a direction that is normal to the top surface of metal layer 332.

As a result, metal layer 332 provides openings for a number of substantially optically transparent (to a wavelength of light) paths that extends from the openings to the source and other photodiode regions, while at the same time blocking light rays that are normal to the top surface of metal layer 332 from reaching the remaining portions of circuit 300, e.g., the source of NMOS transistor 112, and the gates and drains of transistors 110 and 112.

As further shown in FIG. 3, integrated circuit 300 includes a spacer material 340 that is formed on metal layer 332 and the layer of protective material 330 exposed by opening 332A, and a light source 342 that is formed on spacer material 340. Spacer material 340 is substantially transparent to the wavelengths of light, e.g., green, that are directed at source 310A.

Light source 342, in turn, can be implemented with, for example, a green light-emitting diode (LED) either alone or in combination with a lens arrangement that directs light over a broader area. (The lens structures required to transform a narrow beam of light from an LED into a broad beam of light are well known in the art.) A single light source, or multiple light sources, can be used to illuminate substantially all of the surface of integrated circuit 300.

Thus, one of the benefits of the present invention is that the photovoltaic effect can be used to supply the voltages and currents necessary to operate the logic circuits of a device, particularly when the logic circuits are manufactured with 0.06-micron fabrication processes where a logic one can be represented by a forward bias voltage of approximately 0.6V.

For embodiments where 0.6V is insufficient, such as 0.18-micron processes that represent a logic one with approximately 0.18V, a number of photodiodes can be connected in series to reach the necessary voltage. For example, three photodiodes, which each produce approximately 0.6V individually, produce approximately 1.8V when connected together in series.

Figure 4:
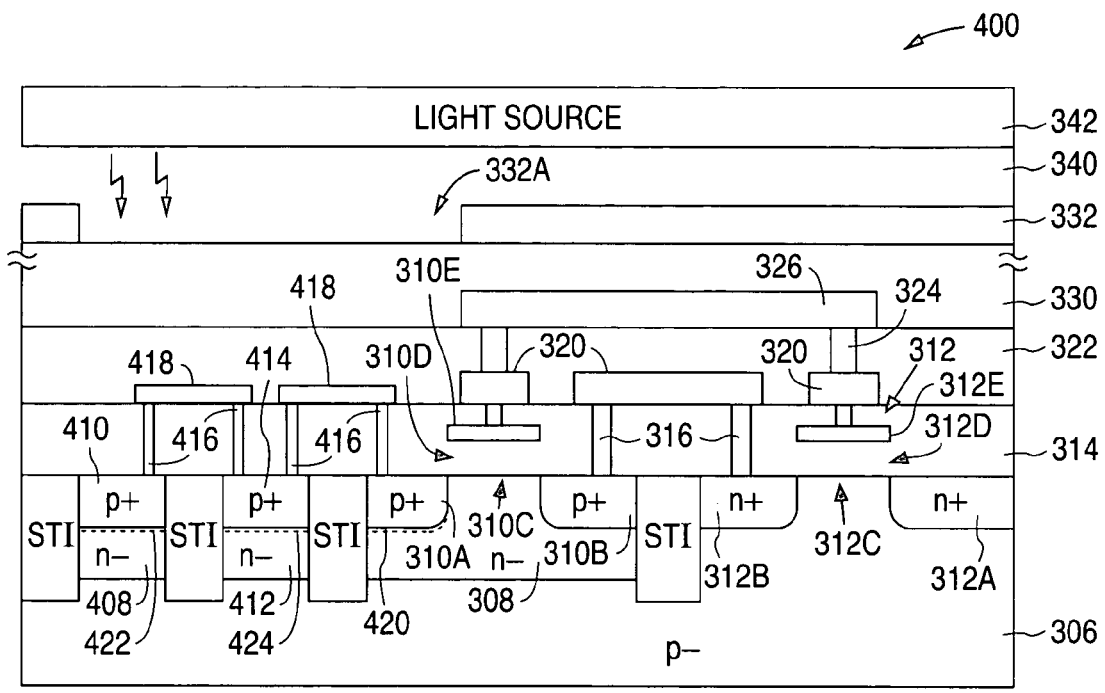
FIG. 4 is a cross-sectional diagram illustrating an example of a laser powered integrated circuit 400 in accordance with the present invention.

FIG. 4 shows a cross-sectional diagram that illustrates an example of a laser powered integrated circuit 400 in accordance with the present invention. Integrated circuit 400 is similar to integrated circuit 300 and, as a result, utilizes the same reference numerals to designate the structures which are common to both circuits.

As shown in FIG. 4, integrated circuit 400 differs from integrated circuit 300 in that integrated circuit 400 includes a p+ region 410 that is formed in an n-well 408 which, in turn, is formed in p− substrate 306. In addition, integrated circuit 400 includes a p+ region 414 that is formed in an n-well 412 which, in turn, is formed in p− substrate 306. Further, contacts 416, which are formed through insulation layer 314, and metal-1 traces 418, which are formed on insulation layer 314, connect p+ regions 310A, 410, and 412 in series.

In operation, p+ regions 310A, 410, and 412 each generate a voltage of approximately 0.6V due to the photovoltaic effect. These voltages, in turn, are added together due to the series connection to produce a voltage of approximately 0.18V on source 310A of PMOS transistor 310.

Figure 5:
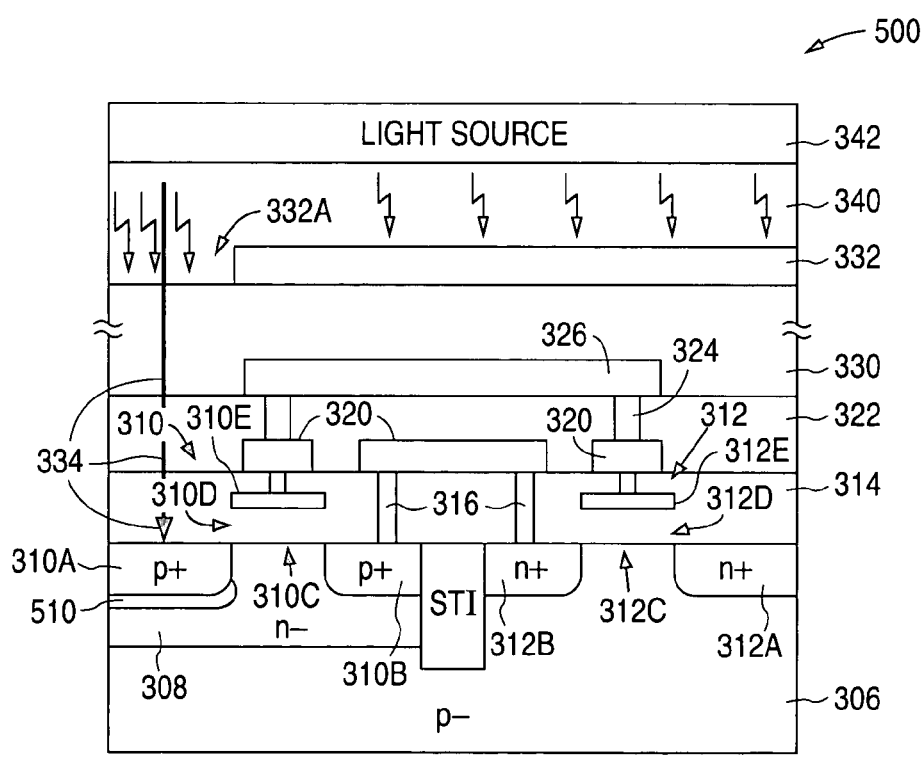
FIG. 5 is a cross-sectional diagram illustrating an example of a laser powered integrated circuit 500 in accordance with an alternate embodiment of the present invention.

FIG. 5 shows a cross-sectional diagram that illustrates an example of a laser powered integrated circuit 500 in accordance with an alternate embodiment of the present invention. Integrated circuit 500 is similar to integrated circuit 300 and, as a result, utilizes the same reference numerals to designate the structures which are common to both circuits.

As shown in FIG. 5, integrated circuit 500 differs from integrated circuit 300 in that integrated circuit 500 has a capacitance raising region 510 that is formed at the junction of p+ source 310A and n-well 308. Region 510, which can be implemented with, for example, an n+ region, raises the capacitance of source 310A which, in turn, increases the charge that can be stored in source 310A.

In addition, capacitance raising regions can also be used with integrated circuit 400. As shown in FIG. 4, a capacitance raising region 420 can optionally be formed at the junction of p+ source 310A and n− well 308, a capacitance raising region 422 can optionally be formed at the junction of p+ region 410 and n− well 408, and a capacitance raising region 424 can optionally be formed at the junction of p+ region 414 and n− well 412.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A laser powered integrated circuit comprising:
   a body of a first conductivity type;
   spaced-apart source and drain regions of a second conductivity type formed in the body, the source region having a size;
   a channel region located between the source and drain regions;
   a layer of insulation material formed over the channel region;
   a gate formed on the layer of insulation material over the channel region;
   a layer of insulation material formed over the source and drain regions, and the gate; and
   a layer of metal that is formed over the layer of insulation material, the layer of metal having a top surface and an opening that lies substantially vertically over the source region.

2. The laser powered integrated circuit of claim 1 wherein a single straight and substantially optically transparent path to a wavelength of light extends from the opening to all of the top surface of the source region.

3. The laser powered integrated circuit of claim 1 wherein the layer of metal prevents light rays that are normal to the top surface of the layer of metal from penetrating into any portion of the gate.

4. The laser powered integrated circuit of claim 1 wherein the layer of metal prevents light rays that are normal to the top surface of the layer of metal from penetrating into any portion of the drain region.

5. The laser powered integrated circuit of claim 2 wherein the opening has a size that substantially matches the size of the source region.

6. The laser powered integrated circuit of claim 2 and further comprising:
   a spacer material formed over the layer of metal, the spacer material providing a substantially optically transparent path to the wavelength of light; and
   a light source formed over the spacer material, the light source outputting the wavelength of light.

7. The laser powered integrated circuit of claim 6 wherein the light source includes a light emitting diode.

8. The laser powered integrated circuit of claim 6 wherein the light source includes a light emitting diode and a lens structure.

9. The laser powered integrated circuit of claim 2 and further comprising:
   a semiconductor material of the first conductivity type; and
   a photodiode region of the second conductivity type formed in the semiconductor material, the photodiode region being electrically connected to the source region,
   wherein the layer of metal prevents light rays that are normal to the top surface of the layer of metal from penetrating into any portion of the gate and drain region.

10. The laser powered integrated circuit of claim 9 wherein the opening lies substantially vertically over the source region and the photodiode region, and a substantially optically transparent path to the wavelength of light extends from the opening to the source region and the photodiode region.

11. The laser powered integrated circuit of claim 3 and further comprising a capacitance raising region that contacts the source region and the body, and has the first conductivity type and a dopant concentration that is greater than a dopant concentration of the body.

12. A method of powering an integrated circuit, the integrated circuit including:
   a body of a first conductivity type;
   spaced-apart source and drain regions of a second conductivity type formed in the body;
   a channel region of the first conductivity type located between and contacting the source and drain regions;
   a layer of insulation material formed over the channel region;
   a gate formed on the layer of insulation material over the channel region; and
   a layer of insulation material formed over the source region, the drain region, and the gate, the method comprising generating a wavelength of electromagnetic radiation that enters the source region to generate a voltage on the source region which is greater than a voltage on the drain region.

13. The method of claim 12 and further comprising blocking the wavelength of electromagnetic radiation from directly entering any portion of the drain region.

14. The method of claim 13 and further comprising blocking the wavelength of electromagnetic radiation from directly entering any portion of the gate.

15. The method of claim 13 wherein the wavelength of electromagnetic radiation is absorbed in a region between the source region and the body.

16. A laser powered integrated circuit comprising:
a body of a first conductivity type;
spaced-apart source and drain regions of a second conductivity type formed in the body, the source region having a top surface, the drain region having a top surface;
a channel region of the first conductivity type located between and contacting the source and drain regions;
a layer of insulation material that contacts the body and lies over the channel region;
a gate that contacts the layer of insulation material over the channel region; and
a generator that outputs a wavelength of electromagnetic radiation, the wavelength of electromagnetic radiation entering the source region to generate a voltage on the source region which is greater than a voltage on the drain region.

17. The laser powered integrated circuit of claim 16 and further comprising an insulation region lying over the source region, the drain region, and the gate, the generator contacting the insulation region.

18. The laser powered integrated circuit of claim 17 and further comprising a layer of metal that contacts the insulation region, the layer of metal having an opening that lies directly vertically over the top surface of the source region, and lying directly vertically over the top surface of the drain region to cover all of the top surface of the drain region.

19. The laser powered integrated circuit of claim 17 and further comprising a capacitance raising region that contacts the source region and the body, and has the first conductivity type and a dopant concentration that is greater than a dopant concentration of the body.

20. The laser powered integrated circuit of claim 17 and further comprising:
a semiconductor material of the first conductivity type; and
a photodiode region of the second conductivity type formed in the semiconductor material, the photodiode region being electrically connected to the source region.

* * * * *